United States Patent
Hsieh (10) Patent No.: US 9,178,503 B2
(45) Date of Patent: Nov. 3, 2015

(54) DIFFERENTIAL COMPARATOR CIRCUIT HAVING A WIDE COMMON MODE INPUT RANGE

(75) Inventor: Cheng-Hsiang Hsieh, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 591 days.

(21) Appl. No.: 12/790,425

(22) Filed: May 28, 2010

(65) Prior Publication Data

US 2011/0291758 A1 Dec. 1, 2011

(51) Int. Cl.
| | |
|---|---|
| G01R 19/00 | (2006.01) |
| G11C 7/00 | (2006.01) |
| H03F 3/45 | (2006.01) |
| H03K 5/22 | (2006.01) |
| G06G 7/26 | (2006.01) |
| H03K 5/24 | (2006.01) |

(52) U.S. Cl.
CPC .................................... *H03K 5/2481* (2013.01)

(58) Field of Classification Search
CPC ............... H03K 5/2481; H03G 3/3042; H03F 3/45183; H03F 3/4521
USPC ............ 327/52, 53, 62, 65, 66, 563; 330/253, 330/261
See application file for complete search history.

(56) References Cited

U.S. PATENT DOCUMENTS

| | | | |
|---|---|---|---|
| 4,706,036 A * | 11/1987 | Rebeschini | 330/253 |
| 5,079,515 A | 1/1992 | Tanimoto | |
| 5,500,623 A | 3/1996 | Kimura | |
| 6,051,999 A | 4/2000 | To et al. | |
| 6,617,926 B2 * | 9/2003 | Casper et al. | 330/258 |
| 6,642,788 B1 * | 11/2003 | Abughazaleh | 330/253 |
| 7,023,275 B2 * | 4/2006 | Miyamoto | 330/254 |
| 2002/0118065 A1 | 8/2002 | Miyamoto | |
| 2003/0190849 A1 * | 10/2003 | Deas et al. | 439/894 |
| 2004/0027200 A1 | 2/2004 | Ashby et al. | |
| 2004/0088594 A1 * | 5/2004 | Canagasaby et al. | 713/400 |
| 2005/0174175 A1 | 8/2005 | Heigelmayer et al. | |
| 2006/0017506 A1 | 1/2006 | Koen et al. | |

OTHER PUBLICATIONS

Redman-White, William, "A High Bandwidth Constant gm and Slew-Rate Rail-to-Rail CMOS Input Circuit and its Application to Analog Cells for Low Voltage VLSI Systems", IEEE Journal of Solid-State Circuits, IEEE Service Center, pp. 702-712, S. vol. 3, No. 5, May 1, 1997, Piscataway, NJ, USA.

* cited by examiner

*Primary Examiner* — Lincoln Donovan
*Assistant Examiner* — Colleen O Toole
(74) *Attorney, Agent, or Firm* — LeRoy D. Maunu; Gerald Chan (57) ABSTRACT

In one embodiment of the invention, a circuit arrangement is provided. The circuit arrangement includes a plurality of differential amplifiers, coupled in parallel, including at least a first differential amplifier and a second differential amplifier. Each differential amplifier includes an adjustable current control circuit coupled to limit a tail current passing through the differential amplifier.

17 Claims, 8 Drawing Sheets

DIFFERENTIAL COMPARATOR CIRCUIT HAVING A WIDE COMMON MODE INPUT RANGE

FIELD OF THE INVENTION

An embodiment of the present invention generally relates to transistor amplification, and more particularly to differential comparators.

BACKGROUND

A difference comparator is a circuit that accepts inputs and determines a difference between them. Typical difference comparators take two inputs and return a signal indicating which of the signals is higher. Many circuits use difference comparators, such as analog to digital converters (ADC) or transceiver circuits.

Difference comparators are commonly used in communications systems to communicate signals between different circuits. For noise-immunity reasons, most communication standards utilize differential signaling. In differential signaling, data is transmitted in the form of a differential voltage across two nodes.

An ideal difference comparator amplifies only the voltage difference between two inputs. Voltages common to both inputs are ideally rejected. However, due to differing communication standards the common mode voltage utilized by various transmitters can vary widely between different transmitters. For example, some standards pick a high common mode voltage ranging, for example, between 700 mV and 1300 mV. Some standards, on the other hand, pick a low common mode voltage ranging, for example, between 145 mV and 350 mV. Transceiver circuits operating according to other standards output common mode voltages between 500 mV and 700 mV when operating in AC-coupled environments. In order to accommodate these various differential transmission circuits, a flexible receiver design needs to be able to accept any common mode voltage between the ground (0 mV) and the termination voltage (about 1200 mV).

One or more embodiments of the present invention may address one or more of the above issues.

SUMMARY

In one embodiment of the invention, a circuit arrangement is provided. The circuit includes a plurality of differential amplifiers coupled in parallel, including at least a first differential amplifier and a second differential amplifier. Each differential amplifier includes an adjustable current control circuit coupled to limit a tail current passing through the differential amplifier.

In another embodiment, a differential comparator circuit having a wideband common mode input range is provided. The differential comparator circuit includes first and second differential input terminals for receiving first and second input signals respectively. A difference between the input signals provides a differential input signal. The differential comparator circuit includes a plurality of complementary differential pair circuits having first and second inputs coupled to the first and second differential input terminals. The plurality of complementary differential pair circuits include at least first and second complementary differential transistor pair circuits. A current summation circuit is coupled to first, second, third, and fourth current outputs of each of the complementary differential pair circuits. A gain control circuit is coupled to the complementary differential pair circuits and configured to independently adjust a tail current of each of the plurality of complementary differential transistor pair circuits.

In yet another embodiment, an input buffer circuit is provided. The input buffer circuit includes a first electrostatic discharge circuit having inputs for receiving a differential signal from a transmission medium. Termination resistors are coupled to differential outputs of the first electrostatic discharge circuit and configured to match the impedance of the input buffer to the impedance of the transmission medium. A differential comparator circuit is coupled to differential output of the termination resistors. The differential comparator circuit includes first and second differential input terminals for receiving first and second input signals respectively. A difference between the input signals provides a differential input signal. The differential comparator circuit includes two or more complementary differential pair circuits coupled in parallel. A current summation circuit is coupled to outputs of the two or more complementary differential pair circuits. A gain control circuit is coupled and configured to independently adjust a tail current of each of the two or more complementary differential pair circuits.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

Complimentary differential pair amplifiers (diff-pairs for short) are often used to perform difference comparison operations. The gain of a typical complimentary diff-pair can vary up to 50 percent when used over a range of common mode voltages. As a result, the gain must be adjusted according to the common mode used. However, this gain adjustment is undesirable as it affects the linearity of the difference comparator output. One or more embodiments of the present invention provide a method and circuit for nearly linear difference comparison that can operate across a wide common-mode input range.

Figure 1:
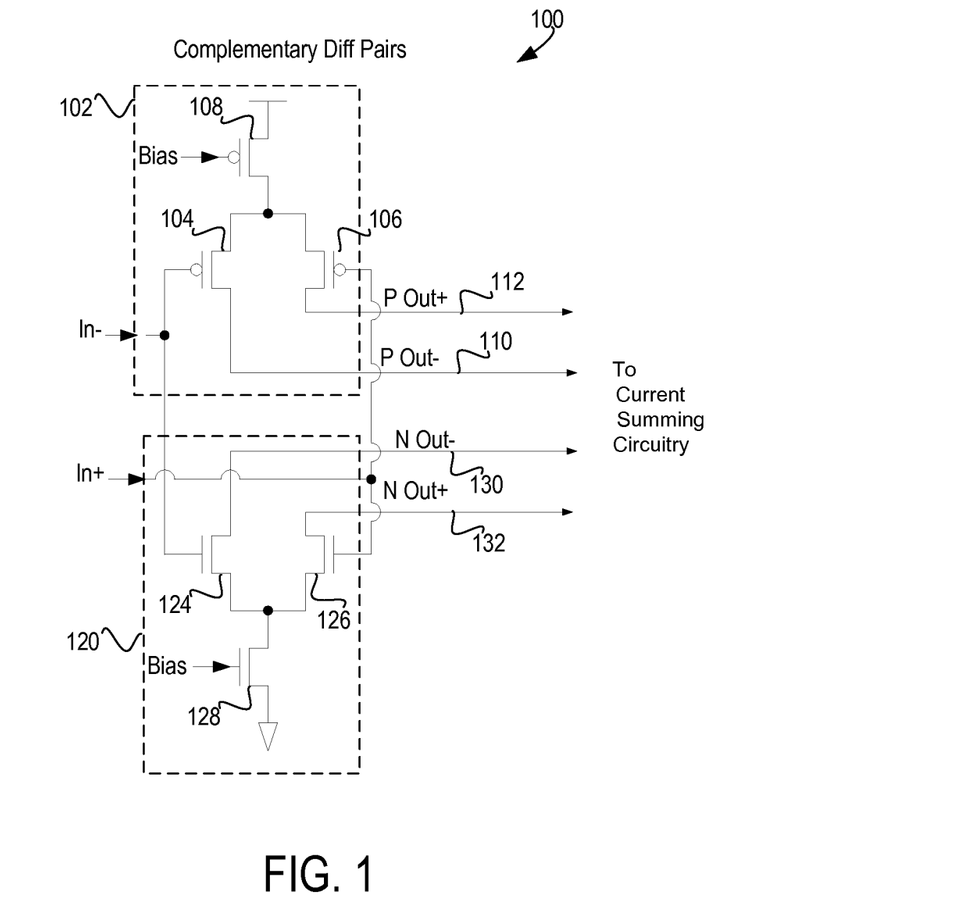
FIG. 1 shows a block diagram of an example complementary diff-pair segment.

In one embodiment of the present invention, complementary diff-pairs are implemented in parallel segments to achieve a wide common-mode voltage input range. FIG. 1 shows a block diagram of an example complementary diff-pair segment. The complementary diff-pair segment includes an NMOS diff-pair 120 and a PMOS diff-pair 102. The NMOS and PMOS diff-pairs 120 and 102 respectively include NMOS transistors 124 and 126 and PMOS transistors 104 and 106 that receive differential inputs and generate tail currents 110, 112, 130, and 132. The difference between the tail currents output from each pair represents the voltage difference of the received differential inputs.

The diff-pair circuits are biased by transistors 108 and 128 against a common mode input voltage bias to center the input signals within the linear operating range of transistors 110, 112, 130, 132. The NMOS diff-pair 120 requires a high common mode biasing. If a low common mode voltage is used, the gate voltage of transistor 128 will be near ground voltage. As a result, the tail currents allowed to pass through transistor 128 will be close to zero. The PMOS diff-pair has the opposite limitation and requires a low common mode voltage. If a high common mode voltage is used, the gate voltage of transistor 108 will be near source voltage. As a result, the tail currents allowed to pass through transistor 108 will be close to zero.

NMOS and PMOS diff-pairs having overlapping common mode operating ranges are used concurrently to form complementary diff-pairs having a wide common-mode input range. The tail currents of each pair will vary linearly according to the input common-mode voltage. If the input is a low common mode voltage, the tail currents of the PMOS diff-pair produce the difference. If the input is a high common mode voltage, the NMOS tail currents produce the difference operation. In this manner, difference tail currents are generated across the entire range of common mode voltages. The tail currents 110 and 112 are summed with respective tail currents 130 and 132 to generate the difference for the entire range.

Figure 2:
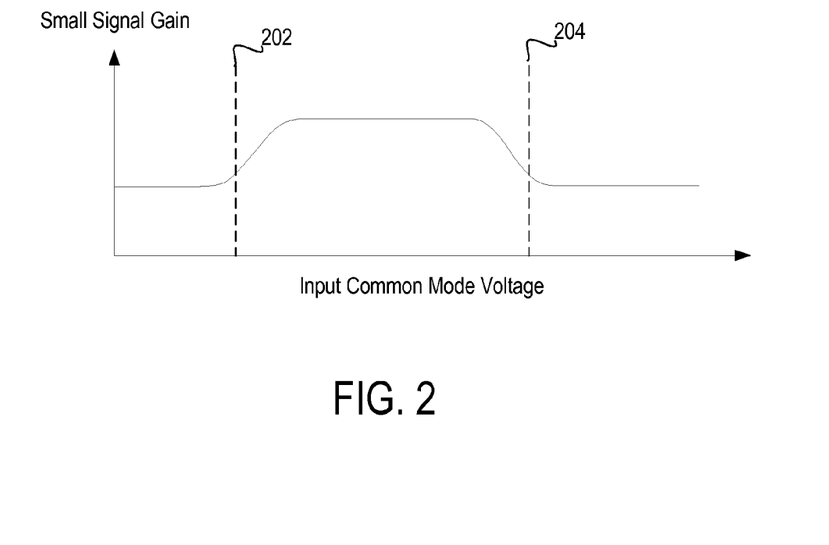
FIG. 2 shows a graph of the gain response of typical complementary diff-pairs over a range of common mode voltages.

Due to the partial overlap in common mode operating ranges, the complementary diff-pairs have increased gain within the overlapping range of common mode voltages. FIG. 2 illustrates a graph of an example gain response of complementary diff-pairs over a range of common mode voltages. When the difference circuit is operating in a low common mode voltage, the PMOS diff-pair produces a tail current. When the common mode voltage increases to threshold 202, the NMOS diff-pair begins to produce tail currents. When both diff-pairs produce tail currents, the gain is doubled. This higher gain is maintained as the common mode voltage increases until threshold 204 is reached, and the PMOS tail current stops producing a tail current.

The 2-to-1 gain increase between thresholds 202 and 204 is in addition to any gain variation due to process, voltage, and temperature variations. To avoid distortion or noise in the difference output that may result from the overlapping gain response, the gain of each of the differential pairs can be automatically adjusted by a monitoring circuit to maintain a steady overall gain.

This can be achieved by a digital feedback loop. Digital signals generate what are known as signal eyes. Signal eyes are areas separated by inter-symbol interference and are defined by the ensemble of all signal waveforms in a baud interval. The signal eyes can be used to determine the gain of the output. Gain variation causes signal amplitude variation, which changes the vertical size of the post-equalization signal eye. Post-equalization of the output signal eye size is compared against a desired target signal eye. The comparison results then go through digital filtering to determine a necessary amount of gain adjustment. Control signals are then generated to adjust the gain of the diff-pair. A loop of this kind is typically called an automatic-gain-control (AGC) loop or a variable-gain-amplifier (VGA) loop. One skilled in the art will recognize that other AGC methods known in the art may be adapted for use in one or more embodiments of the present invention.

In one embodiment of the present invention, the gain is adjusted by trimming the tail currents as indicated by the control signals. The tail currents are trimmed by adjusting the gate voltage of transistors 108 and 128 shown in FIG. 1. Transistors 108 and 128 are adjusted to limit the current flow though the N and P diff-pairs. In this manner, a uniform gain across a wide common-mode input range can be achieved. One skilled in the art will recognize that other circuits known in the art may be used in place of transistors 108 and 128 to trim tail currents such as variable current source adjustable resistors, etc.

Figure 3:
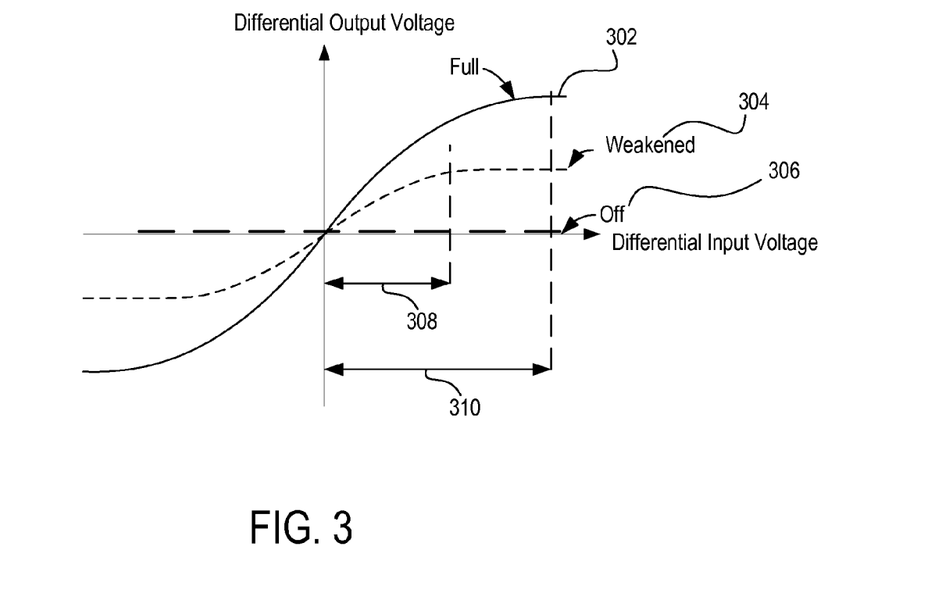
FIG. 3 illustrates the output of the complementary differential pair resulting from trimming of the tail current.

Trimming of the comparator circuit gain may affect the linearity of the output. FIG. 3 illustrates the output of complementary differential pairs before and after trimming of the tail current. Output 302 represents the transfer curve of a complementary diff-pair with the maximum tail current. This is referred to as the "full" state as used herein. Output 304 represents the transfer curve of the diff-pair following trimming of the tail current. This is referred to as the "weakened" case. The weakened diff-pair has a smaller gain. As the tail current is further decreased, the diff-pair will eventually be turned off completely. This is referred to as the "Off" state and is represented by output transfer curve 306. In the Off state, the output is zero and the transfer curve will overlap with the x-axis.

A downside of using the tail-current weakening for gain reduction is that the process reduces the linear input range of the diff-pair. As shown in FIG. 3, the weakened output transfer curve 304 has a smaller linear range 308 as compared to the linear input range 310 of the full output transfer curve 302. It is observed that the nonlinearity of a weakened diff-pair reaches maximum half way through the weakening process. In the beginning of the weakening (the full state), the diff-pair is substantially linear. As the gain approaches zero (the off state), the diff-pair produces a linear, if albeit small, gain output. Therefore, a diff-pair is only subject to a loss of linearity while in the weakened state.

To minimize the linearity loss, one or more embodiments of the present invention implement the differential comparison using several complementary diff-pair segments in parallel. By selectably enabling and/or trimming the gain of each diff-pair segment individually, the gain of the various diff-pair segments is controlled in a manner that reduces the number of segments in the weakened state at any given time, thereby increasing linearity.

Figure 4:
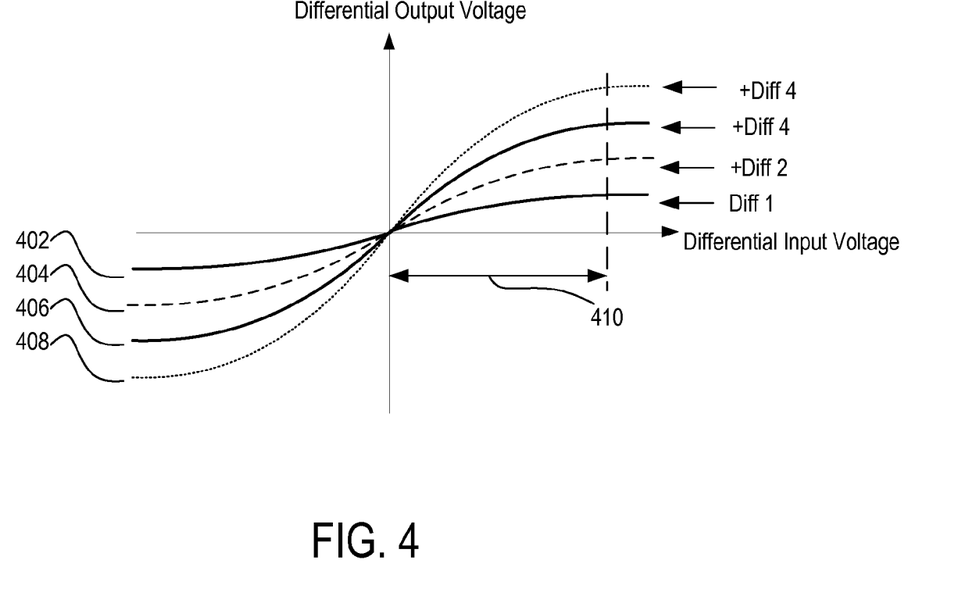
FIG. 4 illustrates example output gain transfer curves of segmented diff-pair coupled in various combinations.

FIG. 4 shows a graph of output gain transfer curves of diff-pair segments coupled in various combinations. In this example, four identical complementary diff-pairs are operated in various combinations to produce four different outputs. Operation of a first diff-pair segment in the full or enabled state produces the 1× gain transfer curve 402. When two diff-pairs are operated in parallel, the summed output results in the 2× gain output transfer curve 404. Operation of three or four of the diff-pair circuits produces respective 3× gain and 4× gain output transfer curves 406 and 408.

In this example, each enabled diff-pair is operated in the full state. Because no gain reduction of individual diff-pairs is performed, the four output transfer curves 402, 404, 406, and 408 each have the linear input range 410. In this manner, the overall gain can be adjusted without introducing non-linearity.

A small portion of the segments may be operated in a weakened state to achieve gain values between those provided by the full state segments as shown in FIG. 4. The resulting non-linearity is proportional to the total gate area of the weakened segments in comparison to the total gate area of non-weakened segments. The more segments that operate in a weakened state, the more non-linearity is introduced.

Figure 5:
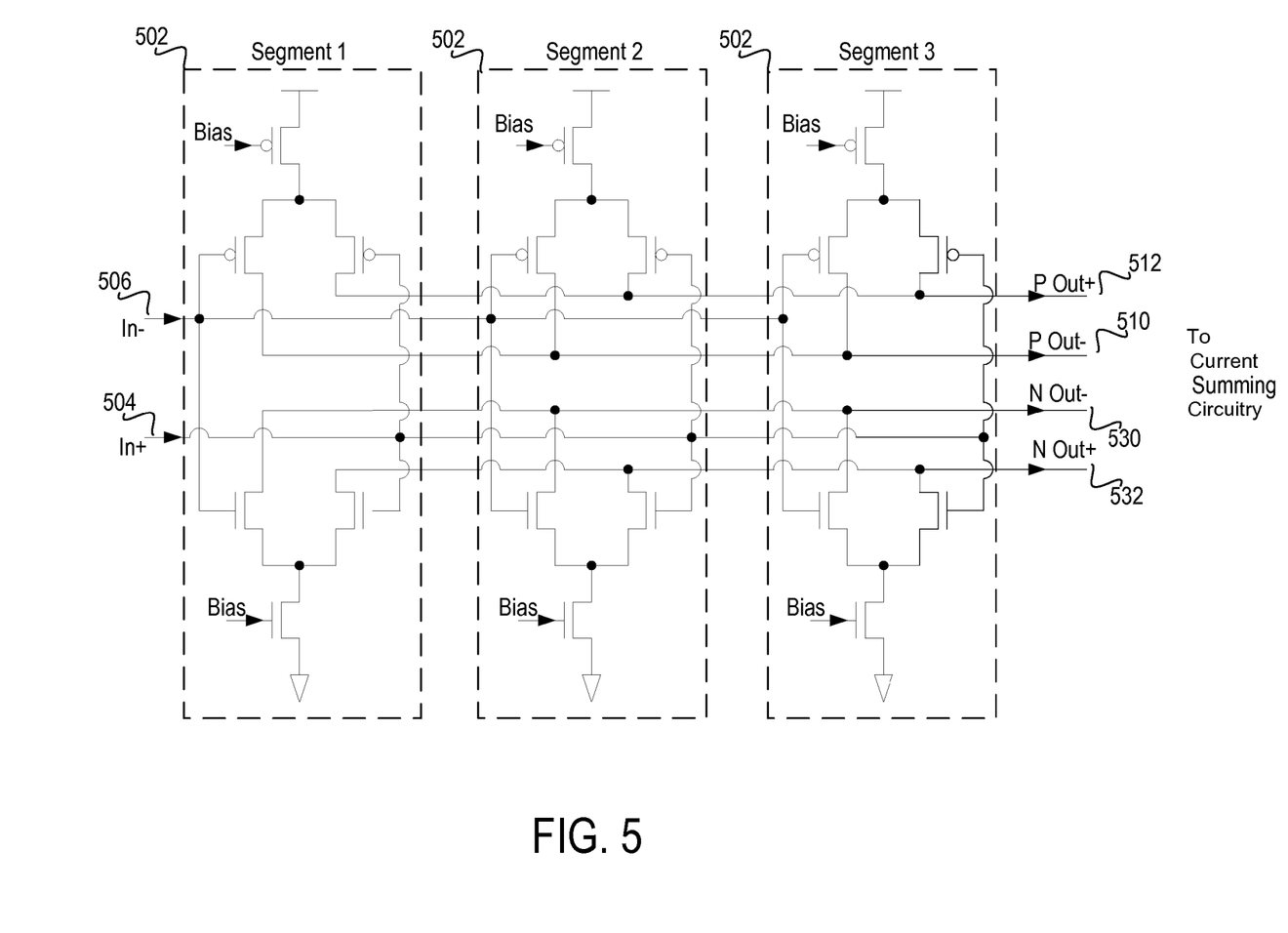
FIG. 5 shows a circuit diagram of an example comparator circuit implemented with parallel diff-pair segments.

FIG. 5 shows an example of the comparator circuit implemented in parallel diff-pair segments. In this example, the circuit is implemented using the complementary diff-pairs 502 as shown and discussed in FIG. 1. The inputs of each diff-pair 502 are coupled in parallel to differential inputs 504 and 506. The outputs of the three segments are coupled in parallel to tail current outputs 510, 512, 530, and 532.

For ease of discussion, this example is limited to three complementary diff-pair segments. One skilled in the art will recognize that any number of segments may be used to achieve a desired level of linearity of gain adjustment. If more segments are implemented, the non-linearity of a weakened diff-pair segment will be smaller with respect to the total gain. Depending on the resolution requirement of the gain trimming, ten or more segments may likely be used to implement the diff-pair.

In one embodiment of the invention, the gain is adjusted in a manner that operates no more than one diff-pair segment in the weakened state at a given time. Although some non-linearity may be introduced by one diff-pair segment, the non-linearity is not significant in comparison to the strong linearity provided by the majority of the segments operating in the full or off states.

Figure 6:
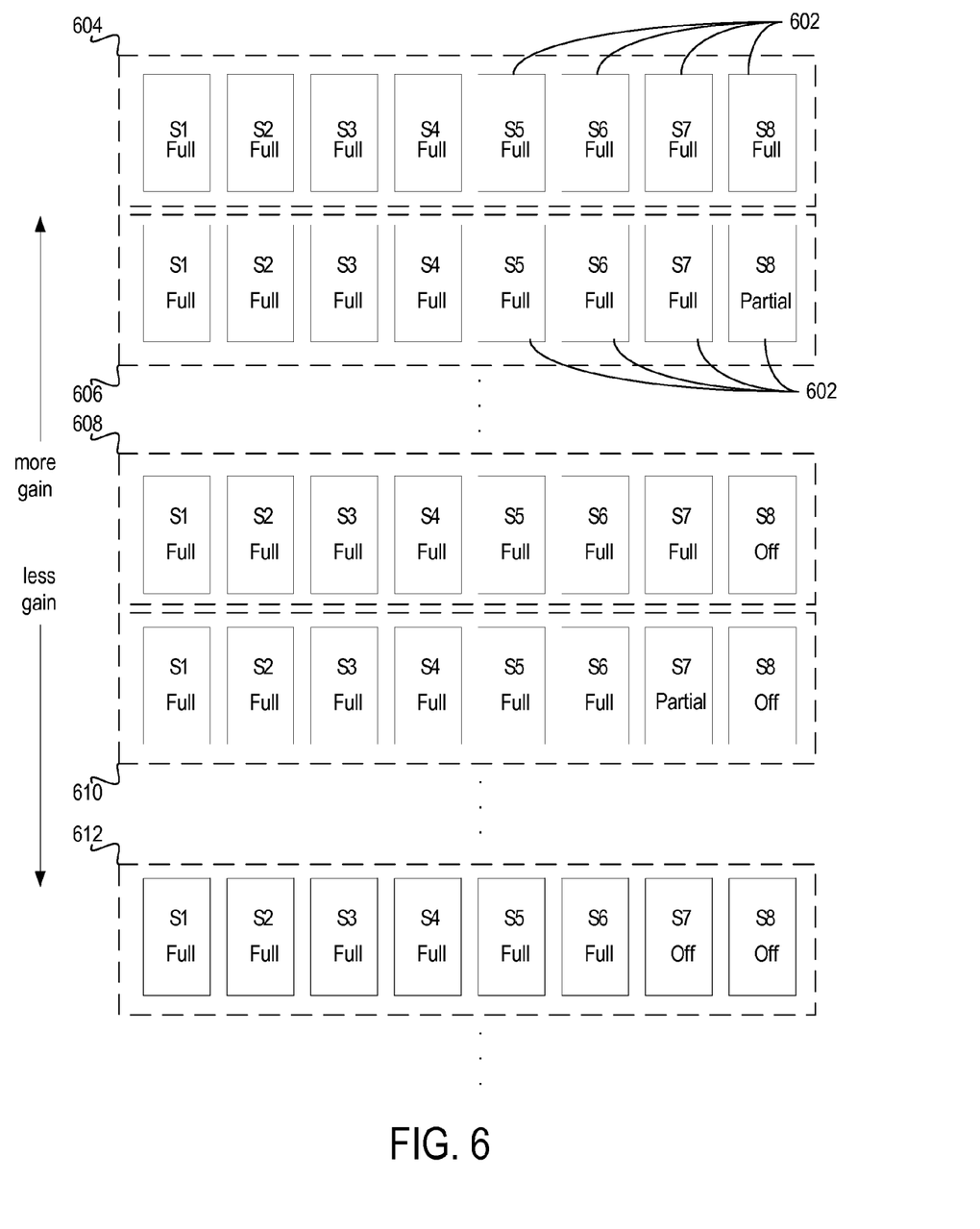
FIG. 6 illustrates an example gain adjustment of a segmented diff-pair.

FIG. 6 illustrates the gain adjustment operation of an example segmented diff-pair. In this example, the diff-pair is implemented with eight diff-pair segments. Each row 604, 606, 608, 610, and 612 represents the tail current state of the diff-pair segments 602 for a particular overall gain setting.

In the first row 604, the gain is set to the maximum. All eight segments are set to the full tail current state. Decreasing the gain places the segments into states shown in the next lower row 606. In this row, the gain is set to one level below the maximum. The tail current of last segment S8 is trimmed to place the segment in a partially weakened state. The remaining seven segments S1-S7 are operated with no trimming of their tail currents. To reduce the gain of the circuit another level, the last segment is further trimmed (not shown). This process will be repeated as the gain is decreased until the tail current of the last segment drops to zero, as shown in row 608. After segment S8 has reached the Off state, gain is decreased by trimming segment S7, as shown in row 610. The gain can be decreased in this manner until all segments 602 are placed in the Off state.

Figure 7:
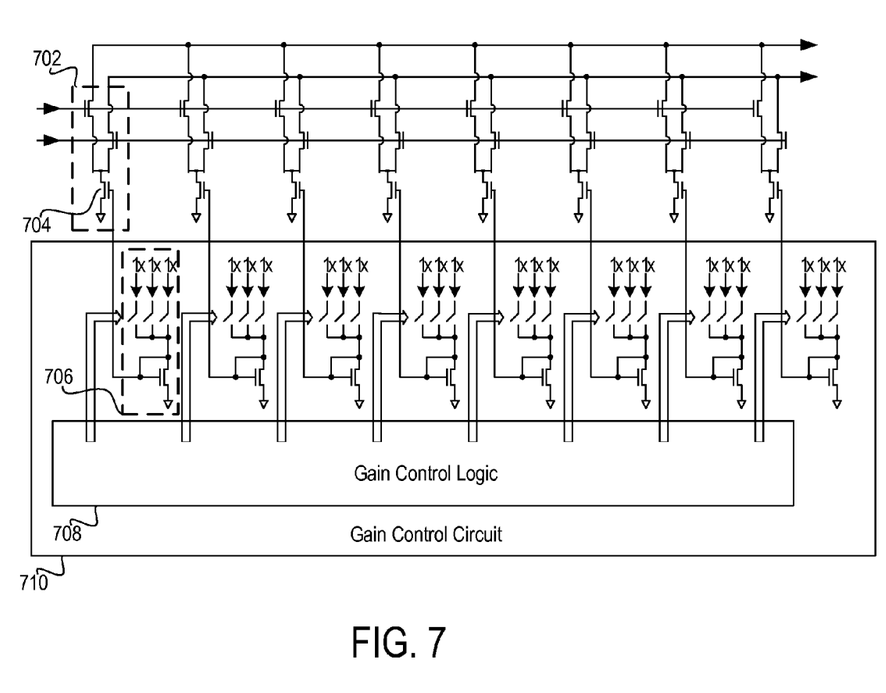
FIG. 7 shows a circuit diagram of an example segmented diff-pair and gain control circuit.

FIG. 7 shows a circuit diagram of an example segmented diff-pair and gain control circuit. Although a complementary diff-pair is needed to provide a wide common mode range, for ease of illustration, this example only shows the N-diff-pair portion of each complementary diff-pair segment. It is understood that the P-diff-pair portion of each segment, as shown in 102 of FIG. 1, would be controlled in a similar manner.

The gain adjustment of each diff-pair 702 is performed by weakening of the tail current as discussed above. In this example, tail currents are weakened by adjusting the biasvoltage of an adjustable current control circuit 704 in each diff-pair. The adjustable current control circuit 704 is adjusted by a gain control circuit 710. In this example implementation, the gain control circuit 710 includes a gain control logic circuit 708 and several trim control circuits 706. Each trim control circuit 706 adjusts the bias voltage according to control signals output from gain control logic 708. In this example, the gain control logic 708 adjusts the number of 1× current units that are turned on and mirrored into the diff-pair tail. This sets the bias voltage to a discrete voltage dependent on the number of 1× current units enabled. The number of selectable current units included in the trim control circuit 706 dictates the granularity of gain adjustment within the weakened state. For example, if each trim control circuit 706 includes N selectable current units, N selectable current units are enabled in the full state. While in a weakened state, the selectable current units may be enabled in various combinations to generate N−1 evenly spaced discrete bias voltages. A larger number of selectable current units included in each trim control circuit 706 will result in a finer adjustment to the gain. One skilled in the art will recognize that other circuits known in the art may be used to generate discrete or non-discrete bias voltages in response to signals from the gain control logic 708.

In one example implementation, the signals output to the trim control circuits 706 can be generated by an analog-to-digital converter configured for thermometer coding. In thermometer coding schemes, a string of bits includes a number of adjacent ones. The number of ones in the string represents the value of the code. For example, in a four-bit thermometer code possible values include '0001', '0011', '0111', and '1111'. To implement the circuit shown in FIG. 7 a 24-bit (8×3) thermometer code could be used to control the eight trim control circuits 706 with 3-bit values.

Referring to FIG. 6, the last segment S8 is controlled by the first three most significant bits 23-21. The next segment S7, is controlled by the next three most significant bits 20-18, and so on. When the gain is set to the maximum, as shown in the first row 604, all 24 bits of the thermometer code are high. When the gain is decreased one level 606, bit 23 is set to 1 and bits 22-0 are set to 0. When the gain is set to two levels below the maximum, bits 23-22 are set to 1 and bits 21-0 are set to 0, and so on. Because bits of the thermometer code that are set high are adjacent to one another, only one segment will be operated in a weakened state at a given time.

Figure 8:
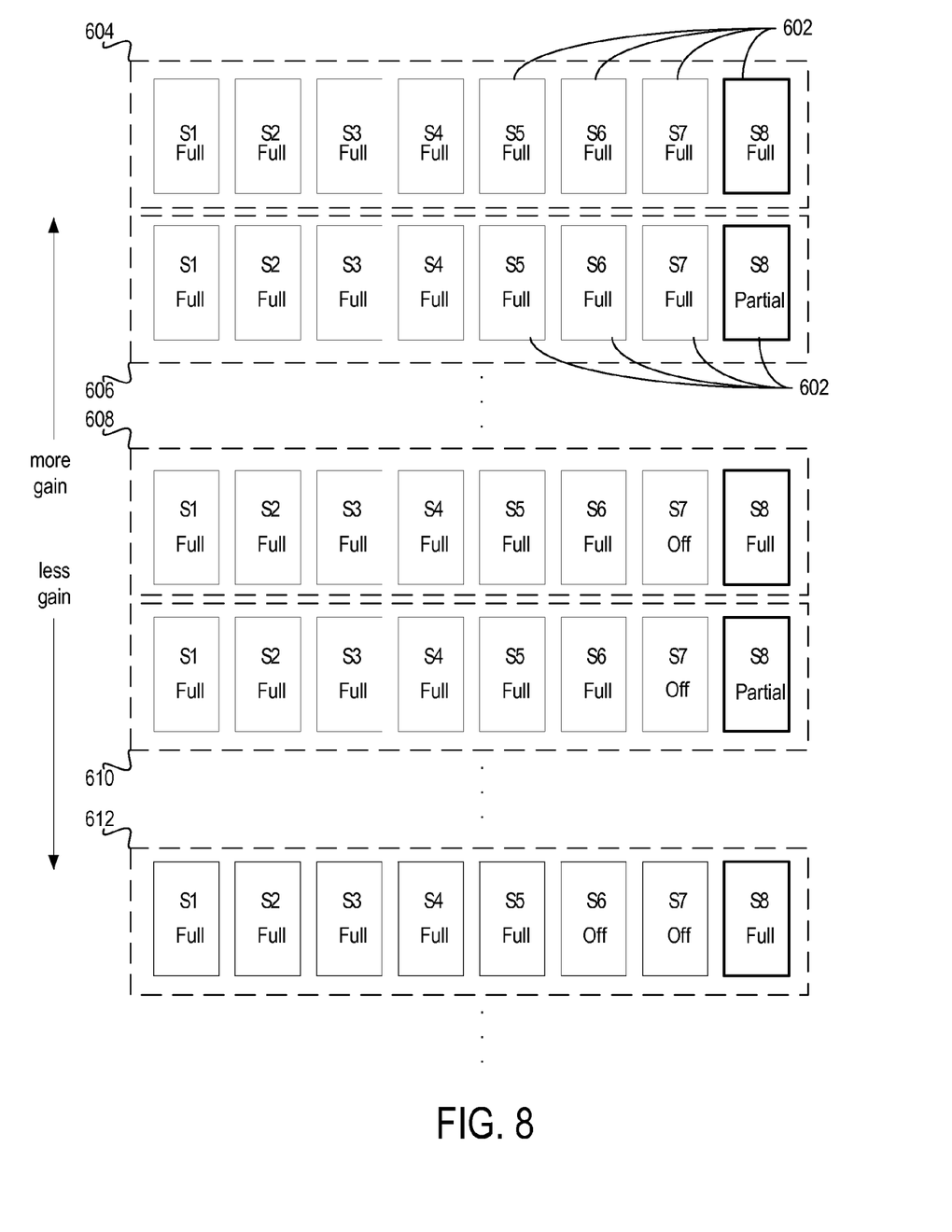
FIG. 8 illustrates an example gain adjustment with operation in the weakened state limited to one particular segment.

In another example implementation, operation in a weakened state may be limited to one particular diff-pair segment. Operation of the other segments is limited to the full or off states. FIG. 8 illustrates the gain adjustment shown in FIG. 6 implemented with operation in the weakened state limited to one particular segment.

As shown in FIG. 8, each row 604, 606, 608, 610, and 612 illustrates the tail current state of diff-pair segments 602 for a particular overall gain setting. In the first row 604, the gain is set to the maximum. All eight segments are set to the full tail current state. Decreasing the gain places the segments into states shown in the next lower row 606. In this row, the gain is set to one level below the maximum. The tail current of last segment S8 is trimmed to place the segment in a partially weakened state. The remaining seven segments S1-S7 are operated with no trimming of their tail currents. To reduce the gain of the circuit to another level, the last segment is further trimmed (not shown). This process will be repeated as the gain is decreased until the tail current of the last segment is in the lowest weakened state. When gain is further weakened, segment S7 is switched from the full to off state, and segment S8 is set to the full state, as shown in row 608. Segment S8 is weakened as gain is adjusted downward until S8 again is in the lowest weakened state (not shown). When gain is further weakened, segment S6 is switched from the full to off state and segment S8 is set to the full state, as shown in row 612. The gain can be decreased in this manner until all segments 602 are placed in the off state.

Limiting operation in the weakened state to one particular segment has the benefit of reducing hardware required to implement trim control circuits 704 for each segment as shown in FIG. 7 but increases the complexity of the gain control logic 708. One skilled in the art will recognize that gain may be adjusted by trimming the tail current of segments according to a number of different orderings that reduce non-linearity of the gain adjustment.

Figure 9:
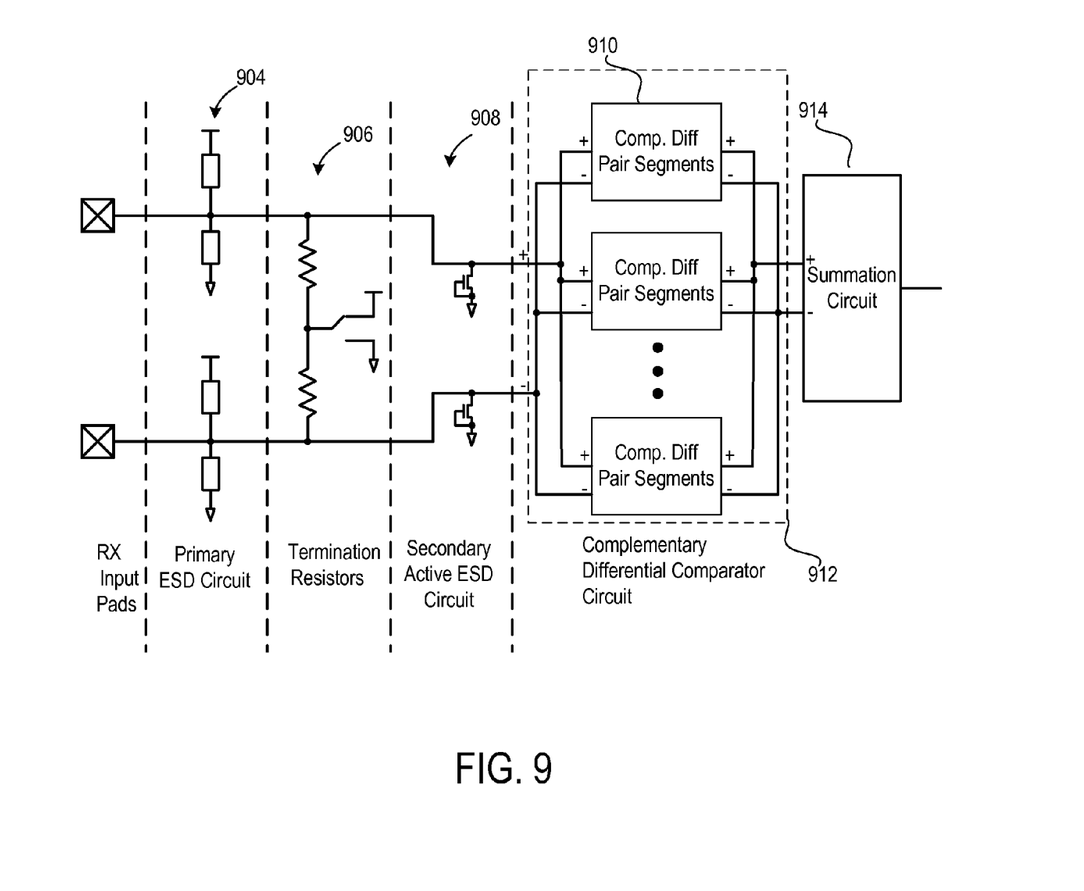
FIG. 9 shows a circuit diagram of an example input buffer circuit implemented in accordance with several embodiments of the present invention.

FIG. 9 shows a block diagram of an example input buffer circuit implemented in accordance with several embodiments of the present invention. In this example, a differential signal is received and processed by a primary electrostatic discharge (ESD) circuit 904. The ESD circuit 904 prevents damage to the input buffer in case of sudden unwanted electric current on the transmission medium. Termination resistors 906 are included after the primary ESD circuit 904. The termination resistors 906 match the impedance of the input buffer to the impedance of the transmission medium and minimize signal reflection. A secondary active ESD circuit 908 is coupled after the termination resistors to further protect the circuit from electrostatic pulses.

An equalizer frontend implemented with a differential comparator circuit 912 receives and processes the signal from the secondary active ESD 908. The differential comparator circuit 912 produces a difference of the received differential input independent of the input common mode voltage. As discussed above, the differential comparator 912 includes a plurality of complementary diff-pair segments 910 coupled in parallel. Use of the complementary diff-pair allows the equalizer to process any common mode voltages between ground and the power supply. The tail currents of each segment 910 are trimmed to provide a linear response and a uniform gain across the entire mode range. The resulting tail currents are summed by a summation circuit 914 to provide the resulting difference.

One or more embodiments of the present invention are thought to be applicable to a variety of applications utilizing differential pair amplifier circuits. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit arrangement, comprising:
 a plurality of differential amplifiers, coupled in parallel, including at least a first differential amplifier and a second differential amplifier;
 for each differential amplifier, a respective adjustable current control circuit coupled to the differential amplifier to limit a tail current passing through the differential amplifier, the adjustable current control circuit being configured to operate in one state of a discrete set of states including fully-on, fully-off, and partially-on, wherein operation of the adjustable current control circuit in the partially-on state causes the differential amplifier to exhibit non-linearity; and
 a gain control circuit coupled to the adjustable current control circuits, the gain control circuit configured to adjust, while the adjustable current control circuits for two or more of the plurality of differential amplifiers are operated in respective states other than the fully-off state, the adjustable current control circuits such that only one of the plurality of respective current control circuits can be operated in the partially-on state at a given time, thereby limiting non-linearity exhibited by the plurality of differential amplifiers.

2. The circuit arrangement of claim 1, wherein:
 the gain control circuit is further configured to adjust, in response to a trim control signal indicating the tail current is to be increased, one or more of the adjustable current control circuits to increase the tail currents passing through the respective differential amplifiers; and
 the gain control circuit is further configured to adjust, in response to the trim control signal indicating the tail current is to be decreased, one or more of the adjustable current control circuits to decrease the tail currents passing through the respective differential amplifiers.

3. The circuit arrangement of claim 1, wherein the adjustable current control circuits are adjustable to a plurality of discrete current levels while operating in the partially-on state.

4. The circuit arrangement of claim 1, wherein each differential amplifier of the plurality of differential amplifiers includes two complementary differential transistor pairs.

5. The circuit arrangement of claim 4, further comprising a current summation circuit coupled to first and second current outputs of each of the differential transistor pairs of the plurality of the differential amplifiers.

6. The circuit arrangement of claim 1, wherein the adjustable current control circuits are adjustable current sources.

7. The circuit arrangement of claim 1, wherein the adjustable current control circuits are MOSFET transistors.

8. The circuit arrangement of claim 7, wherein gate dimensions of the MOSFET transistors are substantially identical.

9. The circuit arrangement of claim 4, wherein gate dimensions of the complementary differential transistor pairs in each differential amplifier are substantially identical.

10. A differential comparator circuit having a wideband common mode input range, comprising:
 first and second differential input terminals for receiving first and second input signals respectively, a difference between the input signals providing a differential input signal;
 a plurality of complementary differential pair circuits having inputs coupled to the first and second differential input terminals and each pair having first, second, third, and fourth outputs, the plurality of complementary differential pair circuits including at least first and second complementary differential transistor pair circuits, respectively;
 a current summation circuit coupled to the first, second, third, and fourth current outputs of the complementary differential pair circuits;
 a gain control circuit coupled to the complementary differential pair circuits and configured to independently adjust a tail current of each of the plurality of complementary differential transistor pair circuits;
 wherein the plurality of complementary differential pair circuits are configurable, via the adjustment of the tail currents, to operate in one state of a discrete set of states consisting of fully-on, fully-off, and partially-on; and
 wherein the gain control circuit is configured to adjust the tail currents such that while two or more of the plurality of complementary differential pair circuits are operated in respective states other than the fully-off state, only one of the plurality of complementary differential pair circuits is operated in the partially-on state at a given time.

11. The differential comparator circuit of claim 10, wherein:
   each of the complementary differential pair circuits includes an NMOS differential pair and a PMOS differential pair having overlapping common mode input ranges; and
   the gain control circuit is configured to decrease the gain of the differential comparator circuit, via adjustment of the tail currents, in response to the differential comparator circuit operating within the overlapping common mode input ranges.

12. The differential comparator circuit of claim 10, wherein the gain control circuit is configured to adjust the tail current of each of the plurality of complementary differential transistor pair circuits by adjusting a current control circuit included in each of the plurality of complementary differential transistor pair circuits.

13. The differential comparator circuit of claim 12, wherein the adjustable current control circuits are adjustable current sources.

14. The differential comparator circuit of claim 12, wherein the adjustable current control circuits are MOSFET transistors.

15. The differential comparator circuit of claim 14, wherein gate dimensions of the MOSFET transistors are substantially identical.

16. An input buffer circuit, comprising:
   a first electrostatic discharge circuit having inputs for receiving a differential signal from a transmission medium;
   termination resistors coupled to differential outputs of the first electrostatic discharge circuit and configured to match the impedance of the input buffer to the impedance of the transmission medium;
   a differential comparator circuit coupled to differential output of the termination resistors, the differential comparator circuit including two or more complementary differential pair circuits coupled in parallel;
   a current summation circuit coupled to outputs of the two or more complementary differential pair circuits; and
   a gain control circuit coupled and configured to independently adjust a tail current of each of the two or more complementary differential pair circuits such that while two or more of the plurality of complementary differential pair circuits are operated in respective states other than the fully-off state, only one of the plurality of plurality of complementary differential pair circuits is operated in the partially-on state at a given time.

17. The input buffer circuit of claim 16, further comprising a second electrostatic discharge circuit coupled between the termination resistors and the differential comparator circuit.

* * * * *